(12) United States Patent
Kim

(10) Patent No.: US 10,374,189 B2
(45) Date of Patent: Aug. 6, 2019

(54) OPTO-ELECTRONIC ELEMENT AND METHOD FOR MANUFACTURING THE SAME

(71) Applicant: Samsung Display Co., Ltd., Yongin-si, Gyeonggi-do (KR)

(72) Inventor: Dong Chan Kim, Gunpo-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 40 days.

(21) Appl. No.: 15/234,657

(22) Filed: Aug. 11, 2016

(65) Prior Publication Data
US 2017/0148953 A1    May 25, 2017

(30) Foreign Application Priority Data
Nov. 20, 2015    (KR) .......................... 10-2015-0163056

(51) Int. Cl.
| | |
|---|---|
| H01L 51/52 | (2006.01) |
| H01L 27/12 | (2006.01) |
| H01L 27/32 | (2006.01) |
| H01L 33/42 | (2010.01) |

(Continued)

(52) U.S. Cl.
CPC ........ *H01L 51/5234* (2013.01); *H01L 27/124* (2013.01); *H01L 27/3276* (2013.01); *H01L 33/42* (2013.01); *H01L 33/62* (2013.01); *H01L 51/5008* (2013.01); *H01L 51/5206* (2013.01); *H01L 51/5215* (2013.01); *H01L 27/322* (2013.01); *H01L 2227/323* (2013.01);

(Continued)

(58) Field of Classification Search
CPC ... H01L 51/5092; H01L 51/5206–5218; H01L 51/5221–5234; H05B 33/26; H05B 33/28
See application file for complete search history.

(56) References Cited

U.S. PATENT DOCUMENTS

| | | | | |
|---|---|---|---|---|
| 5,776,623 A | * | 7/1998 | Hung | .................. H01L 51/5092 313/502 |
| 6,278,236 B1 | * | 8/2001 | Madathil | ............. H01L 51/5092 313/504 |

(Continued)

FOREIGN PATENT DOCUMENTS

| | | |
|---|---|---|
| KR | 10-0924462 B1 | 11/2009 |
| KR | 10-2011-0057008 A | 5/2011 |
| KR | 10-2011-0108270 A | 10/2011 |

OTHER PUBLICATIONS

Park, Soohyung et al.; "Electronic structures of CuI interlayers in organic electronic devices: An interfacial studies of N,N'-diphenyl-N, N'-bis(1-naphthyl)-1,1'-biphenyl-4,4'-diamine/CuI and tris-(8-hydroxyquinolinato)aluminum/CuI"; Organic Electronics; 15; 2014; pp. 3298-3305.

(Continued)

*Primary Examiner* — Eric A. Ward
(74) *Attorney, Agent, or Firm* — Lewis Roca Rothgerber Christie LLP

(57) ABSTRACT

An opto-electronic element according to an exemplary embodiment of the present disclosure includes a transparent conductive layer including a first material made of a metal and a second material made of a metal halide.

27 Claims, 17 Drawing Sheets
(3 of 17 Drawing Sheet(s) Filed in Color)

(51) Int. Cl.
*H01L 33/62* (2010.01)
*H01L 51/50* (2006.01)
(52) U.S. Cl.
CPC ............ *H01L 2251/5346* (2013.01); *H01L 2933/0016* (2013.01); *H01L 2933/0066* (2013.01)

(56) References Cited

U.S. PATENT DOCUMENTS

| | | | | |
|---|---|---|---|---|
| 6,551,725 B2* | 4/2003 | Raychaudhuri | ..... | H01L 51/5092 313/502 |
| 6,707,248 B1* | 3/2004 | Burroughs | ........ | H01L 51/5231 313/504 |
| 7,071,615 B2* | 7/2006 | Lu | ...................... | H01L 51/0021 313/504 |
| 7,411,223 B2* | 8/2008 | Liu | .................... | H01L 51/0021 257/741 |
| 8,093,587 B2* | 1/2012 | Shiratori | ............. | H01L 51/5234 257/40 |
| 8,227,978 B2 | 7/2012 | Lee et al. | | |
| 8,735,876 B2* | 5/2014 | Hwang | ............... | H01L 51/5231 257/40 |
| 8,766,291 B2* | 7/2014 | Forrest | ................ | H01L 51/5016 257/440 |
| 9,595,688 B2* | 3/2017 | Kim | ..................... | H01L 51/5215 |
| 2004/0070334 A1* | 4/2004 | Buckley | ............. | H01L 51/5221 313/504 |
| 2012/0097956 A1* | 4/2012 | Yun | ........................ | B82Y 20/00 257/59 |
| 2012/0112628 A1* | 5/2012 | Yoon | ................... | H01L 51/5231 313/504 |

OTHER PUBLICATIONS

Santos-Ortiz, Reinaldo et al.; "Microstructure and Electronic Band Structure of Pulsed Laser Deposited Iron Fluoride Thin Film for Battery Electrodes"; ACS Applied Materials and Interfaces; 5; 2013; pp. 2387-2391.

* cited by examiner

OPTO-ELECTRONIC ELEMENT AND METHOD FOR MANUFACTURING THE SAME

CROSS-REFERENCE TO RELATED APPLICATION

This application claims priority to and the benefit of Korean Patent Application No. 10-2015-0163056, filed in the Korean Intellectual Property Office on Nov. 20, 2015, the entire content of which is incorporated herein by reference.

BACKGROUND

1. Technical Field

The present disclosure relates to an opto-electronic element and a manufacturing method thereof.

2. Description of the Related Art

In general, an indium tin oxide (ITO) layer (in which tin is doped to indium oxide) has been widely utilized as a transparent conductive layer utilized as an electrode material of a display device (such as a liquid crystal display or an organic light emitting diode display), or an opto-electronic element (such as a solar cell).

For the indium tin oxide (ITO) layer, it is possible to apply an etching process, and it has an excellent close contacting property with (e.g., excellent adhesion to) the substrate as well as excellent transparency and superior conductivity.

The ITO layer may be formed by a sputtering method, however, if the ITO layer is formed on an organic material layer made of an organic material, the organic material layer may be damaged (e.g., by the sputtering process).

The above information disclosed in this Background section is only to enhance the understanding of the background of the disclosure, and therefore it may contain information that does not form the prior art that is already known in this country to a person of ordinary skill in the art.

SUMMARY

An aspect according to one or more embodiments of the present disclosure is directed toward an opto-electronic element including a new transparent conductive layer, and a manufacturing method thereof.

An opto-electronic element according to an exemplary embodiment of the present disclosure includes a transparent conductive layer including a first material made of a metal and a second material made of a metal halide.

A valence electron number of the metal of the first material may be equal to or larger than a valence electron number of the metal of the metal halide included in the second material.

The metal of the first material may include at least one selected from the group consisting of Group 1 elements, Group 2 elements, Lanthanide elements, Actinide elements, transition metals, and post transition metals.

The metal halide of the second material may include at least one selected from the group consisting of halides of Group 1 elements, halides of Group 2 elements, Lanthanide halides, Actinide halides, halides of transition metals, and halides of post transition metals.

The metal of the first material may include at least one selected from the group consisting of Yb, Tm, Sm, Eu, Gd, La, Ce, Pr, Nd, Pm, Tb, Dy, Ho, Er, Lu, Ac, Th, and Pa.

The metal halide of the second material may include at least one selected from the group consisting of LiF, NaF, KF, RbF, CsF, $BeF_2$, $MgF_2$, $CaF_2$, $SrF_2$, $BaF_2$, $YbF_2$, $YbF_3$, $SmF_2$, $SmF_3$, $EuF_2$, $EuF_3$, $TmF_2$, $TmF_3$, CuF, TlF, AgF, $CdF_2$, $HgF_2$, $SnF_2$, $PbF_2$, $BiF_3$, $ZnF_2$, $MnF_2$, $FeF_2$, $GeF_2$, $CoF_2$, $NiF_2$, $AlF_3$, $ThF_4$, $UF_3$, LiCl, NaCl, KCl, RbCl, CsCl, $BeCl_2$, $MgCl_2$, $CaCl_2$, $SrCl_2$, $BaCl_2$, $YbCl_2$, $YbCl_3$, $SmCl_2$, $SmCl_3$, $EuCl_2$, $EuCl_3$, $TmCl_2$, $TmCl_3$, CuCl, TlCl, AgCl, $CdCl_2$, $HgCl_2$, $SnCl_2$, $PbCl_2$, $BiCl_3$, $ZnCl_2$, $MnCl_2$, $FeCl_2$, $GeCl_2$, $CoCl_2$, $NiCl_2$, $AlCl_3$, $ThCl_4$, $UCl_3$, LiBr, NaBr, KBr, RbBr, CsBr, $BeBr_2$, $MgBr_2$, $CaBr_2$, $SrBr_2$, $BaBr_2$, $YbBr_2$, $YbBr_3$, $SmBr_2$, $SmBr_3$, $EuBr_2$, $EuBr_3$, $TmBr_2$, $TmBr_3$, CuBr, TlBr, AgBr, $CdBr_2$, $HgBr_2$, $SnBr_2$, $PbBr_2$, $BiBr_3$, $ZnBr_2$, $MnBr_2$, $FeBr_2$, $GeBr_2$, $CoBr_2$, $NiBr_2$, $AlBr_3$, $ThBr_4$, $UBr_3$, LiI, NaI, KI, RbI, CsI, $BeI_2$, $MgI_2$, $CaI_2$, $SrI_2$, $BaI_2$, $YbI_2$, $YbI_3$, $SmI_2$, $SmI_3$, $EuI_2$, $EuI_3$, $TmI_2$, $TmI_3$, CuI, TlI, AgI, $CdI_2$, $HgI_2$, $SnI_2$, $PbI_2$, $BiI_3$, $ZnI_2$, $MnI_2$, $FeI_2$, $GeI_2$, $CoI_2$, $NiI_2$, $AlI_3$, $ThI_4$, and $UI_3$.

The transparent conductive layer may include more of the first material than the second material.

The transparent conductive layer may include a same amount of the first material and the second material, or include more of the second material than the first material.

The opto-electronic element may further include a metal oxide layer on the transparent conductive layer.

The metal oxide may include ITO or IZO.

The opto-electronic element may further include a first electrode, an emission layer on the first electrode, and a second electrode on the emission layer, and at least one of the first electrode and the second electrode includes the transparent conductive layer.

The first electrode may be a reflective electrode, and the second electrode may include the transparent conductive layer.

The emission layer may emit white light through a combination of a plurality of emission layers.

The plurality of emission layers may include two layers or three layers.

When the plurality of emission layers includes two layers, light emitted from the plurality of emission layers may be mixed to emit white light.

When the plurality of emission layers include three layers, the plurality of emission layers may respectively emit red light, green light, and blue light, or blue light, yellow light, and blue light.

The opto-electronic element may further include a charge generation layer between the plurality of emission layers.

At least one of the first electrode and the second electrode may include a lower region including more of the first material than the second material, and an upper region including more of the second material than the first material.

In the at least one of the first electrode and the second electrode, an amount of the first material increases from an upper side to a lower side, and an amount of the second material increases from the lower side to the upper side.

The opto-electronic element may further include a metal oxide layer on the upper region, and the metal oxide layer may include ITO or IZO.

A method for manufacturing an opto-electronic element according to an exemplary embodiment of the present disclosure includes forming a transparent conductive layer through a reaction of a first material made of a metal and a second material made of a metal halide.

The metal of the first material may include at least one selected from the group consisting of Group 1 elements, Group 2 elements, Lanthanide elements, Actinide elements, transition metals, and post transition metals; and the metal halide of the second material may include at least one selected from the group consisting of halides of Group 1 elements, halides of Group 2 elements, Lanthanide halides, Actinide halides, halides of transition metals, and halides of post transition metals.

The metal of the first material may include at least one selected from the group consisting of Yb, Tm, Sm, Eu, Gd, La, Ce, Pr, Nd, Pm, Tb, Dy, Ho, Er, Lu, Ac, Th, and Pa; and the metal halide of the second material may include at least one selected from the group consisting of LiF, NaF, KF, RbF, CsF, $BeF_2$, $MgF_2$, $CaF_2$, $SrF_2$, $BaF_2$, $YbF_2$, $YbF_3$, $SmF_2$, $SmF_3$, $EuF_2$, $EuF_3$, $TmF_2$, $TmF_3$, CuF, TlF, AgF, $CdF_2$, $HgF_2$, $SnF_2$, $PbF_2$, $BiF_3$, $ZnF_2$, $MnF_2$, $FeF_2$, $GeF_2$, $CoF_2$, $NiF_2$, $AlF_3$, $ThF_4$, $UF_3$, LiCl, NaCl, KCl, RbCl, CsCl, $BeCl_2$, $MgCl_2$, $CaCl_2$, $SrCl_2$, $BaCl_2$, $YbCl_2$, $YbCl_3$, $SmCl_2$, $SmCl_3$, $EuCl_2$, $EuCl_3$, $TmCl_2$, $TmCl_3$, CuCl, TlCl, AgCl, $CdCl_2$, $HgCl_2$, $SnCl_2$, $PbCl_2$, $BiCl_3$, $ZnCl_2$, $MnCl_2$, $FeCl_2$, $GeCl_2$, $CoCl_2$, $NiCl_2$, $AlCl_3$, $ThCl_4$, $UCl_3$, LiBr, NaBr, KBr, RbBr, CsBr, $BeBr_2$, $MgBr_2$, $CaBr_2$, $SrBr_2$, $BaBr_2$, $YbBr_2$, $YbBr_3$, $SmBr_2$, $SmBr_3$, $EuBr_2$, $EuBr_3$, $TmBr_2$, $TmBr_3$, CuBr, TlBr, AgBr, $CdBr_2$, $HgBr_2$, $SnBr_2$, $PbBr_2$, $BiBr_3$, $ZnBr_2$, $MnBr_2$, $FeBr_2$, $GeBr_2$, $CoBr_2$, $NiBr_2$, $AlBr_3$, $ThBr_4$, $UBr_3$, LiI, NaI, KI, RbI, CsI, $BeI_2$, $MgI_2$, $CaI_2$, $SrI_2$, $BaI_2$, $YbI_2$, $YbI_3$, $SmI_2$, $SmI_3$, $EuI_2$, $EuI_3$, $TmI_2$, $TmI_3$, CuI, TlI, AgI, $CdI_2$, $HgI_2$, $SnI_2$, $PbI_2$, $BiI_3$, $ZnI_2$, $MnI_2$, $FeI_2$, $GeI_2$, $CoI_2$, $NiI_2$, $AlI_3$, $ThI_4$, and $UI_3$.

The method may further include forming a first electrode; forming an emission layer on the first electrode; and forming a second electrode on the emission layer, and at least one of the forming of the first electrode and the forming of the second electrode may include depositing a lower layer including the first material and an upper layer including the second material on the lower layer, diffusing the first material and the second material, and thereby forming the transparent conductive layer.

As the metals included in the first material and the second material are substituted with each other, the transparent conductive layer may be formed.

The first material may be distributed more than the second material in a lower side of the transparent conductive layer.

The method may further include forming a metal oxide layer on the transparent conductive layer.

At least one of the forming of the first electrode and the forming of the second electrode may utilize a solution method, a thermal evaporation method, a physical vapor deposition method, or a chemical vapor deposition method.

The first electrode may be a reflective electrode, and the second electrode may be formed of the transparent conductive layer.

The method may further include forming a first electrode; forming an emission layer on the first electrode; and forming a second electrode on the emission layer, and at least one of the forming of the first electrode and the forming of the second electrode may include co-depositing the first material and the second material to form the transparent conductive layer.

According to an exemplary embodiment of the present disclosure, ITO (Indium Tin Oxide) may be replaced with the transparent conductive layer.

According to an exemplary embodiment of the present disclosure, the transparent electrode may be formed as one kind of an opto-electronic element without damaging the emission layer in the organic light emitting element.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE EMBODIMENTS

Figure 1:
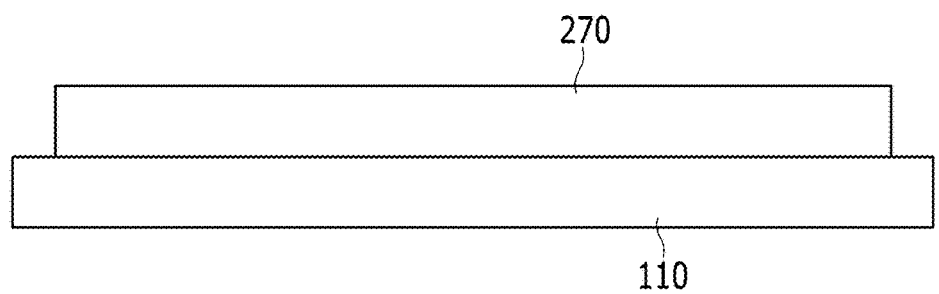
FIG. 1 is a cross-sectional view showing a transparent conductive layer included in an opto-electronic element according to an exemplary embodiment of the present disclosure on a substrate.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

The drawings and description are to be regarded as illustrative in nature and not restrictive, and like reference numerals designate like elements throughout the specification.

In the drawings, size and thickness of each element are arbitrarily illustrated for convenience of description, and the present disclosure is not necessarily limited to what is illustrated in the drawings. In the drawings, the thickness of layers, films, panels, regions, etc., are exaggerated for clarity. In the drawings, the thicknesses of a layer and a region are exaggerated for convenience of description.

It will be understood that when an element such as a layer, film, region, or substrate is referred to as being "on" another element, it can be directly on the other element or intervening element(s) may also be present. In contrast, when an element is referred to as being "directly on" another element, there are no intervening elements present. In addition, the word "on" refers to positioning on or below the object portion, but does not necessarily mean positioning on the upper side of the object portion based on a direction of gravity. Expressions such as "at least one of" or "at least one selected from" when preceding a list of elements, modify the entire list of elements and do not modify the individual elements of the list.

Further, the use of "may" when describing embodiments of the present invention refers to "one or more embodiments of the present invention."

Also, the term "exemplary" is intended to refer to an example or illustration. As used herein, the term "substantially," "about," and similar terms are used as terms of approximation and not as terms of degree, and are intended to account for the inherent deviations in measured or calculated values that would be recognized by those of ordinary skill in the art.

Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In addition, unless explicitly described to the contrary, the word "comprise", and variations such as "comprises" or "comprising", will be understood to imply the inclusion of stated elements but not the exclusion of any other elements.

Further, in the specification, the word "in a plan view" refers to when an object portion is viewed from above, and the word "in a cross-section" refers to when a cross-section taken by vertically cutting an object portion is viewed from the side.

An opto-electronic element is referred to as an element converting an electrical energy into a photo energy, or the photo energy into the electrical energy. The opto-electronic element may include a solar cell, an organic light emitting element, a touch screen panel, and the like. The opto-electronic element includes a conductive layer to flow a current, and the conductive layer may be a transparent conductive layer to transmit light. The transparent conductive layer may be utilized as an electrode.

In the present disclosure, for the electrode or the conductive layer to be (considered) transparent, transmittance of the electrode or the conductive layer may be equal to or more than about 75%, or for example, equal to or more than 85%. The transmittance may be referred to as the transmittance of the visible light region.

Hereinafter, the transparent conductive layer included in the opto-electronic element according to an exemplary embodiment of the present disclosure will be described in more detail.

Figure 2:
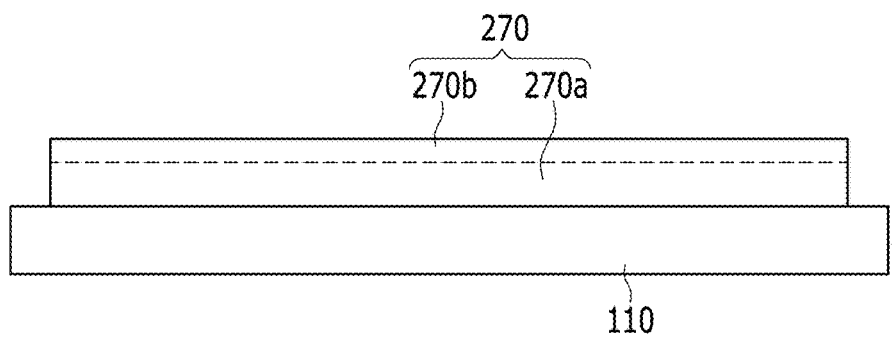
FIG. 2 is a cross-sectional view showing an exemplary variation of the exemplary embodiment described in FIG. 1.
Figure 3:
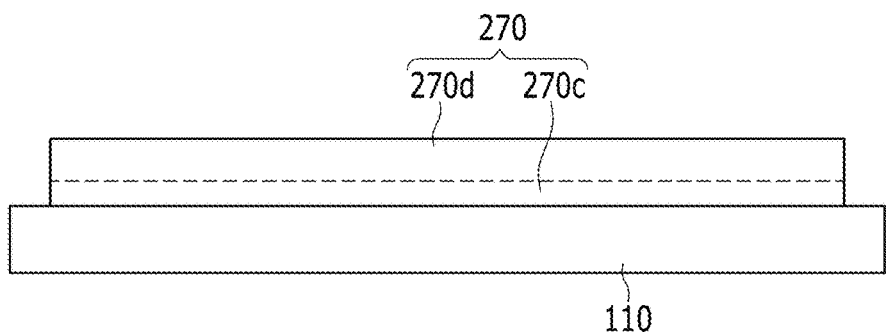
FIG. 3 is a cross-sectional view showing an exemplary variation of the exemplary embodiment described in FIG. 2.

FIG. 1 is a cross-sectional view showing a transparent conductive layer included in an opto-electronic element according to an exemplary embodiment of the present disclosure on a substrate. FIG. 2 is a cross-sectional view showing an exemplary variation of the exemplary embodiment described in FIG. 1. FIG. 3 is a cross-sectional view showing an exemplary variation of the exemplary embodiment described in FIG. 2.

A substrate 110 shown in FIG. 1 to FIG. 3 is utilized to explain a target for depositing the transparent conductive layer, however, the term "substrate" is not limited thereto, and it may be replaced with various suitable targets on which the transparent conductive layer included in the opto-electronic element can be deposited. Also, the target may have various suitable shapes, for example, a circular plate shape such as a wafer.

Referring to FIG. 1, a transparent conductive layer 270 is positioned on a substrate 110. The transparent conductive layer 270 according to an exemplary embodiment of the present disclosure includes a first material made of a metal and a second material made of a metal halide. The metal of the first material may include at least one selected from Group 1 elements, Group 2 elements, Lanthanide elements, Actinide elements, transition metals, and post transition metals; and the metal halide of the second material may include at least one selected from halides of Group 1 elements, halides of Group 2 elements, Lanthanide halides, Actinide halides, halides of the transition metals, and halides of the post transition metals. A refractive index of the second material made of the metal halide according to the present exemplary embodiment may be from 1.3 to 2.5.

In the present exemplary embodiment, the first material and the second material may include metals with standard electrode potentials that are similar to each other. For example, when the first material and the second material respectively include Group 1 elements or Lanthanide elements, it is experimentally confirmed that a spontaneous reaction is generated depending on (e.g., due to) a strong reactivity. Through experimentation, when the first material including Yb and Eu and the second material including RbI and CsI are combined and co-deposited, the first material and the second material are reacted to form an electrode. In this case, the result in which the electrode becomes transparent and its conductivity is relatively increased (e.g., when compared to the conductivity of just one of the first material or the second material) is obtained. However, when combining and co-depositing the first material including Ag and the second material including RbI and CsI to form the electrode, the electrode does not become transparent and its conductivity is not increased. Also, when combining and co-depositing the first material including Yb and Eu and the second material including CuI to be reacted to form the electrode, the electrode does not become transparent and its conductivity is not increased. Accordingly, it is desirable that the metals included in the first material and the second material are materials having a high reactivity to induce the spontaneous reaction.

Among the halide compounds, an iodine compound has low electron affinity of the iodine itself and low electronegativity, thus it is easy for the iodine compound to be dissociated to form an iodine vacancy or be combined with other reactive metals to generate a new compound.

A conduction mechanism will be described below.

In the present exemplary embodiment, the metal included in the first material and the metal of the metal halide included in the second material may be substituted with each other. In this case, a valence electron number of the metal of the first material may be equal to or larger than the valence electron number of the metal of the metal halide included in the second material. If the valence electron number of the metal of the first material is greater than the valence electron number of the metal of the metal halide included in the second material, the conductivity due to the free electrons that are additionally generated may be improved.

Also, if the halogen elements included in the second material are moved into the first material to form a new material, free electrons are formed depending on (e.g., due to) a halogen vacancy, such that conductivity may be improved.

Also, conductivity may be improved by the remaining metal ions that participated in the reaction.

In the present exemplary embodiment, the metal of the first material may include at least one selected from Yb, Tm, Sm, Eu, Gd, La, Ce, Pr, Nd, Pm, Tb, Dy, Ho, Er, Lu, Ac, Th, and Pa. For example, the metal of the first material may be Lanthanide elements such as Yb or Sm.

In the present exemplary embodiment, the metal halide of the second material may include at least one selected from LiF, NaF, KF, RbF, CsF, BeF$_2$, MgF$_2$, CaF$_2$, SrF$_2$, BaF$_2$, YbF$_2$, YbF$_3$, SmF$_2$, SmF$_3$, EuF$_2$, EuF$_3$, TmF$_2$, TmF$_3$, CuF, TlF, AgF, CdF$_2$, HgF$_2$, SnF$_2$, PbF$_2$, BiF$_3$, ZnF$_2$, MnF$_2$, FeF$_2$, GeF$_2$, CoF$_2$, NiF$_2$, AlF$_3$, ThF$_4$, UF$_3$, LiCl, NaCl, KCl, RbCl, CsCl, BeCl$_2$, MgCl$_2$, CaCl$_2$, SrCl$_2$, BaCl$_2$, YbCl$_2$, YbCl$_3$, SmCl$_2$, SmCl$_3$, EuCl$_2$, EuCl$_3$, TmCl$_2$, TmCl$_3$, CuCl, TlCl, AgCl, CdCl$_2$, HgCl$_2$, SnCl$_2$, PbCl$_2$, BiCl$_3$, ZnCl$_2$, MnCl$_2$, FeCl$_2$, GeCl$_2$, CoCl$_2$, NiCl$_2$, AlCl$_3$, ThCl$_4$, UCl$_3$, LiBr, NaBr, KBr, RbBr, CsBr, BeBr$_2$, MgBr$_2$, CaBr$_2$, SrBr$_2$, BaBr$_2$, YbBr$_2$, YbBr$_3$, SmBr$_2$, SmBr$_3$, EuBr$_2$, EuBr$_3$, TmBr$_2$, TmBr$_3$, CuBr, TlBr, AgBr, CdBr$_2$, HgBr$_2$, SnBr$_2$, PbBr$_2$, BiBr$_3$, ZnBr$_2$, MnBr$_2$, FeBr$_2$, GeBr$_2$, CoBr$_2$, NiBr$_2$, AlBr$_3$, ThBr$_4$, UBr$_3$, LiI, NaI, KI, RbI, CsI, BeI$_2$, MgI$_2$, CaI$_2$, SrI$_2$, BaI$_2$, YbI$_2$, YbI$_3$, SmI$_2$, SmI$_3$, EuI$_2$, EuI$_3$, TmI$_2$, TmI$_3$, CuI, TlI, AgI, CdI$_2$, HgI$_2$, SnI$_2$, PbI$_2$, BiI$_3$, ZnI$_2$, MnI$_2$, FeI$_2$, GeI$_2$, CoI$_2$, NiI$_2$, AlI$_3$, ThI$_4$, and UI$_3$.

The transparent conductive layer 270 according to the present exemplary embodiment may have a single layer structure in which the first material and the second material are co-deposited. In the transparent conductive layer 270, if the first material is distributed (e.g., included) more than the second material (e.g., if the first material is included at a higher volume than the second material), conductivity may be increased, but transmittance may be decreased compared to the reverse case (i.e., when the second material is distributed more than the first material). However, contrary to being limited thereto, in the transparent conductive layer 270, the second material may be distributed more than the first material, in which case it has also been experimentally confirmed that the opto-electronic element is lit (e.g., produces light) without a failure. Accordingly, in the present exemplary embodiment, distribution volume of the first material and the second material may be optimized by considering the sheet resistance and transmittance required in the opto-electronic element. Also, the amount (e.g., the volume) of the first material and the second material included in the transparent conductive layer 270 may be substantially the same. In one embodiment, in the transparent conductive layer 270, the amount of the first material increases from an upper side to a lower side, and the amount of the second material increases from the lower side to the upper side. In one embodiment, in the transparent conductive layer 270, the amount of the first material increases continuously from an upper side to a lower side, and the amount of the second material increases continuously from the lower side to the upper side.

In the present exemplary embodiment, the transparent conductive layer 270 may have a transmittance of more than 75% in the visible light region, for example, more than 85%, and a sheet resistance (e.g., conductivity) of less than 500 Ω/□.

Next, an exemplary variation of the exemplary embodiment described in FIG. 1 will be described with reference to FIG. 2.

Referring to FIG. 2, same as in the exemplary embodiment of FIG. 1, the transparent conductive layer 270 is positioned on the substrate 110 and the transparent conductive layer 270 includes the first material made of the metal and the second material made of the metal halide. Also, the description related to the first material and the second material described in reference to FIG. 1 may be applied to the present exemplary embodiment.

However, in the present exemplary embodiment, the transparent conductive layer 270 includes a lower region 270a and an upper region 270b, the first material is distributed more than the second material in the lower region 270a, and the second material is distributed more than the first material in the upper region 270b. On the boundary where the lower region 270a and the upper region 270b meet or in areas around the boundary, the first material is substituted with the metal of the metal halide included in the second material to form a new compound such that the conductive material may be formed. The conductive material may include free electrons and metal ions. For example, when RbI and Yb are reacted, RbI and Yb are substituted with each other, Yb brings (e.g., combines with) iodine to form YbI$_2$ or YbI$_3$, or a material having a perovskite structure such as RbYbI$_3$ may beformed. In this case, conductivity may be improved by the free electrons generated as Rb$^+$ is substituted with Yb$^{2+}$ and/or Yb$^{3+}$, the free electrons depending on (e.g., due to) the iodine vacancy, and/or the metal ions such as Rb$^+$, Yb$^{2+}$, and/or Yb$^{3+}$.

The transparent conductive layer 270 according to the present exemplary embodiment may be formed as follows. A lower layer made of the first material is formed on the substrate 110 and an upper layer made of the second material is formed on the lower layer. In this case, the first material of the lower layer and the second material of the upper layer are respectively diffused without a separate heat treatment, and the first material and the second material are reacted, thereby forming a layer that is transparent and conductive.

Next, an exemplary variation of the exemplary embodiment described in FIG. 2 will be described with reference to FIG. 3.

Referring to FIG. 3, same as in the exemplary embodiments of FIG. 1 and FIG. 2, the transparent conductive layer 270 is positioned on the substrate 110 and the transparent conductive layer 270 includes the first material made of the metal and the second material made of the metal halide. Also, the description related to the first material and the second material described in reference to FIG. 1 and FIG. 2 may be applied to the present exemplary embodiment.

However, in the present exemplary embodiment, the transparent conductive layer 270 includes the lower region 270c where the second material is distributed more than the first material, and the upper region 270d where the first material is distributed more than the second material. The first material is substituted with the metal of the metal halide included in the second material such that the conductive material may be formed on and around the boundary where the lower region 270c and the upper region 270d meet. The conductive material includes free electrons and metal ions.

Although not shown, in the exemplary embodiment described in FIG. 1 to FIG. 3, a metal oxide layer may be further disposed on the transparent conductive layer 270. Here, the metal oxide layer may include ITO or IZO. As such, in the various exemplary embodiments, a dual transparent electrode structure in which the metal oxide layer is positioned on the transparent conductive layer 270 may be formed.

The transparent conductive layer 270 according to the present exemplary embodiment may be formed as follows. The lower layer made of the second material is formed on the substrate 110, and the upper layer made of the first material is formed on the lower layer. In this case, the second material of the lower layer and the first material of the upper layer are diffused without a separate heat treatment and the first material and the second material are reacted, thereby forming a layer that is transparent and conductive.

Figure 4:
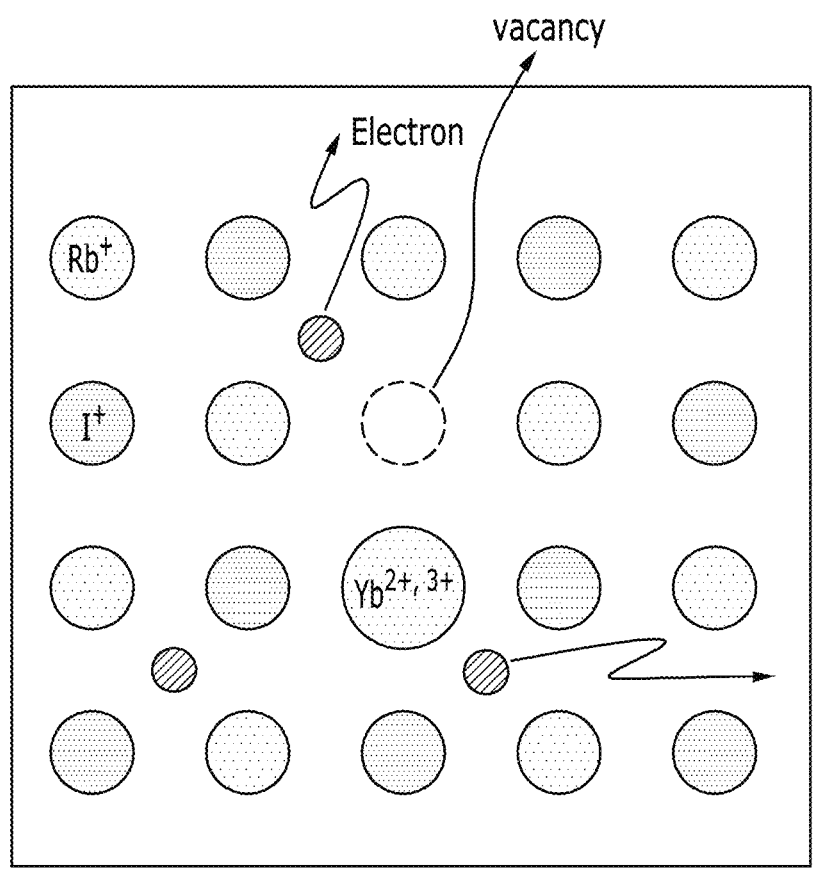
FIG. 4 is a schematic view showing that a transparent conductive layer included in an opto-electronic element according to an exemplary embodiment of the present disclosure has free electrons.

FIG. 4 is a schematic view showing that a transparent conductive layer included in an opto-electronic element according to an exemplary embodiment of the present disclosure has free electrons.

Referring to FIG. 4, the transparent conductive layer corresponding to one example may be formed by utilizing Yb in the first material and RbI in the second material. Yb and RbI may be reacted to form the conductor. In more detail, Rb and Yb may be substituted with each other, and as a result, one or two free electrons may be formed, and/or one or two free electrons may be formed by the iodine (I) vacancy generated depending on (e.g., due to) the formation of the $YbI_2$ or $YbI_3$ compound. As such, the transparent conductive layer according to an exemplary embodiment of the present disclosure may have conductivity (e.g., a suitable conductivity) because of the free electrons formed by one kind of RbI of the metal halide and/or the free electrons and the metal ions formed by the iodine (I) vacancy.

Figure 5:
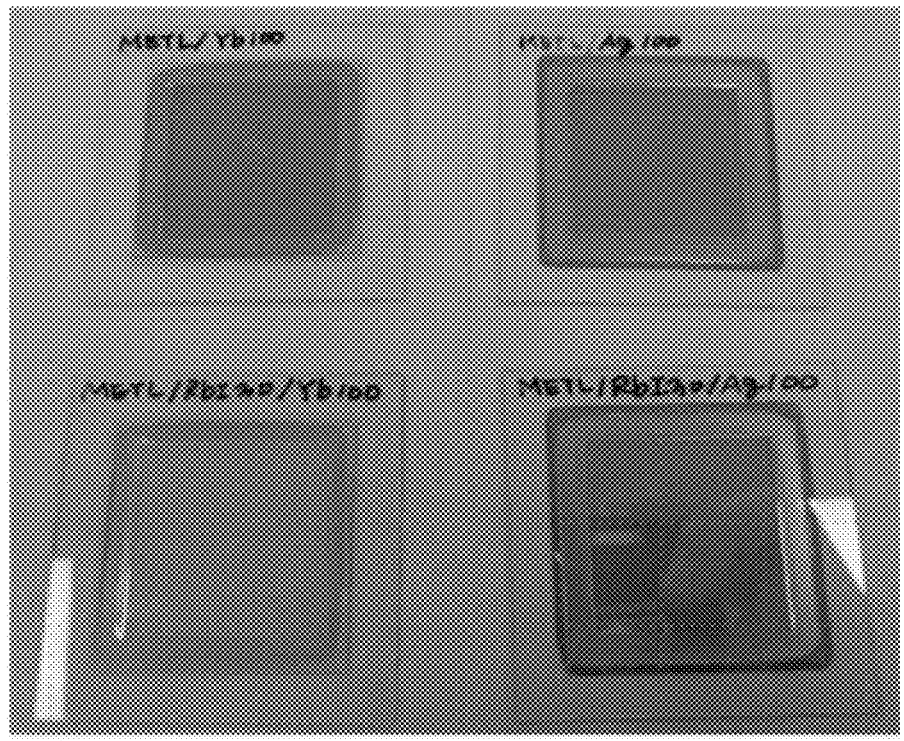
FIG. 5 is a picture showing transmittance increasing due to a reaction of a metal and a metal halide in a transparent conductive layer included in an opto-electronic element according to an exemplary embodiment of the present disclosure.
Figure 6:
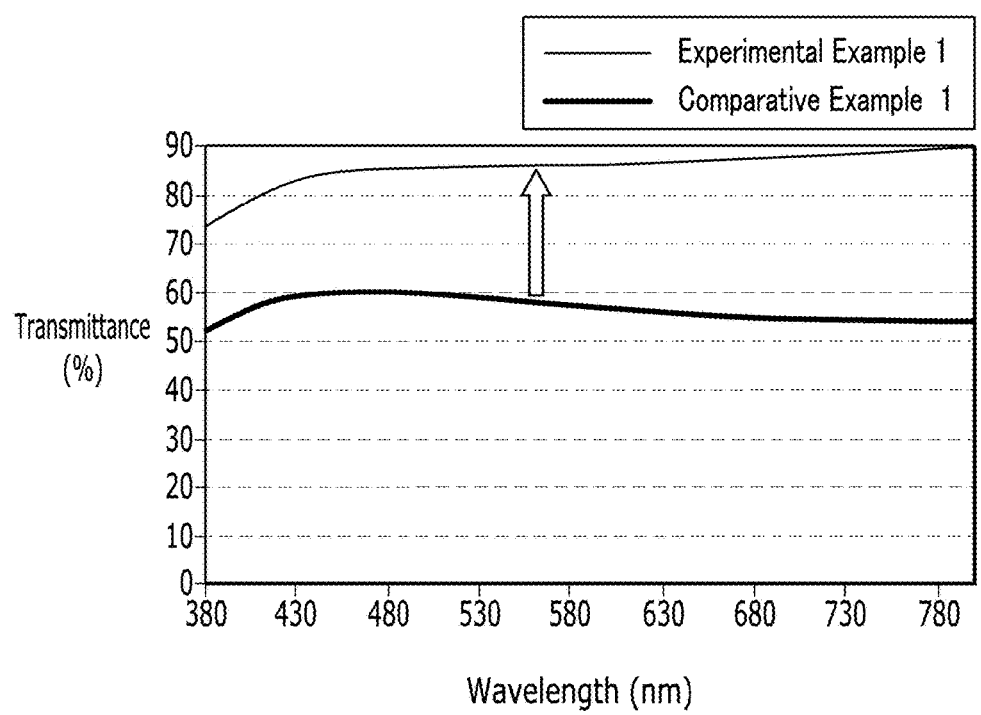
FIG. 6 is a graph showing a wavelength-transmittance due to a reaction of a metal and a metal halide in a transparent conductive layer included in an opto-electronic element according to an exemplary embodiment of the present disclosure.

FIG. 5 shows a transmittance increase due to a reaction of a metal and a metal halide in a transparent conductive layer included in an opto-electronic element according to an exemplary embodiment of the present disclosure. FIG. 6 is a graph showing a wavelength-transmittance relationship due to a reaction of a metal and a metal halide in a transparent conductive layer included in an opto-electronic element according to an exemplary embodiment of the present disclosure.

Referring to FIG. 5 and FIG. 6, if ytterbium (Yb) and silver (Ag) are respectively deposited on a bare glass (that is not processed) to be 100 angstroms (Å) thick, it appears opaque. Next, RbI is deposited to be 30 angstroms (Å) thick on ytterbium (Yb) and silver (Ag) respectively, the transmittance is increased to be transparent only in the case that RbI is deposited on ytterbium (Yb). Particularly, referring to FIG. 6, compared to the case in which ytterbium (Yb) is deposited on the bare glass as in comparative example 1, when the layer made of RbI is formed on the layer made of ytterbium (Yb) as an experimental example 1, ytterbium (Yb) and RbI are reacted such that transmittance of equal to or more than about 85% is achieved.

Figure 7:
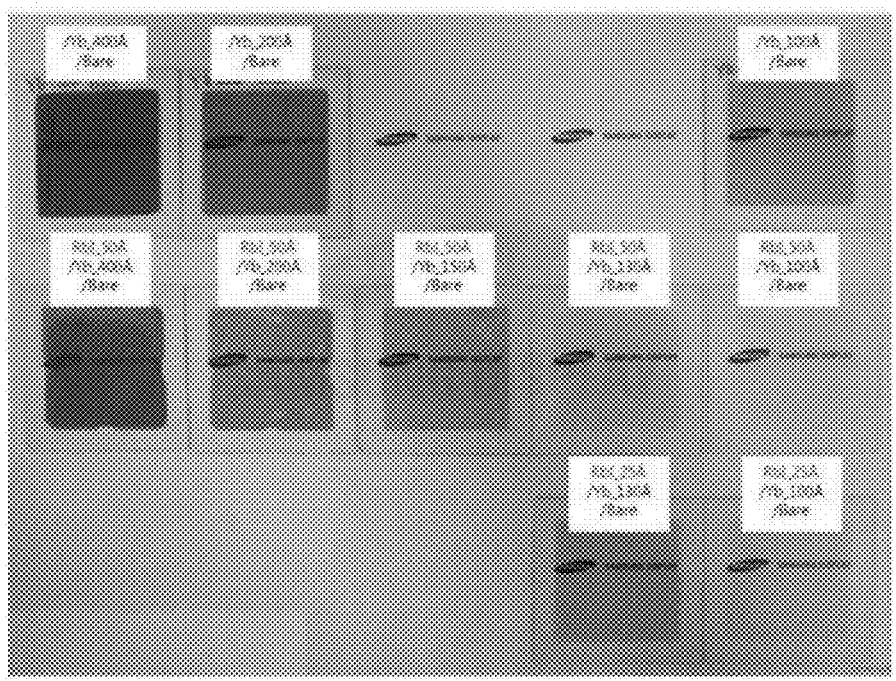
FIG. 7 is a picture showing a transmittance change depending on a thickness change of each component in a transparent conductive layer included in an opto-electronic element according to an exemplary embodiment of the present disclosure.
Figure 8:
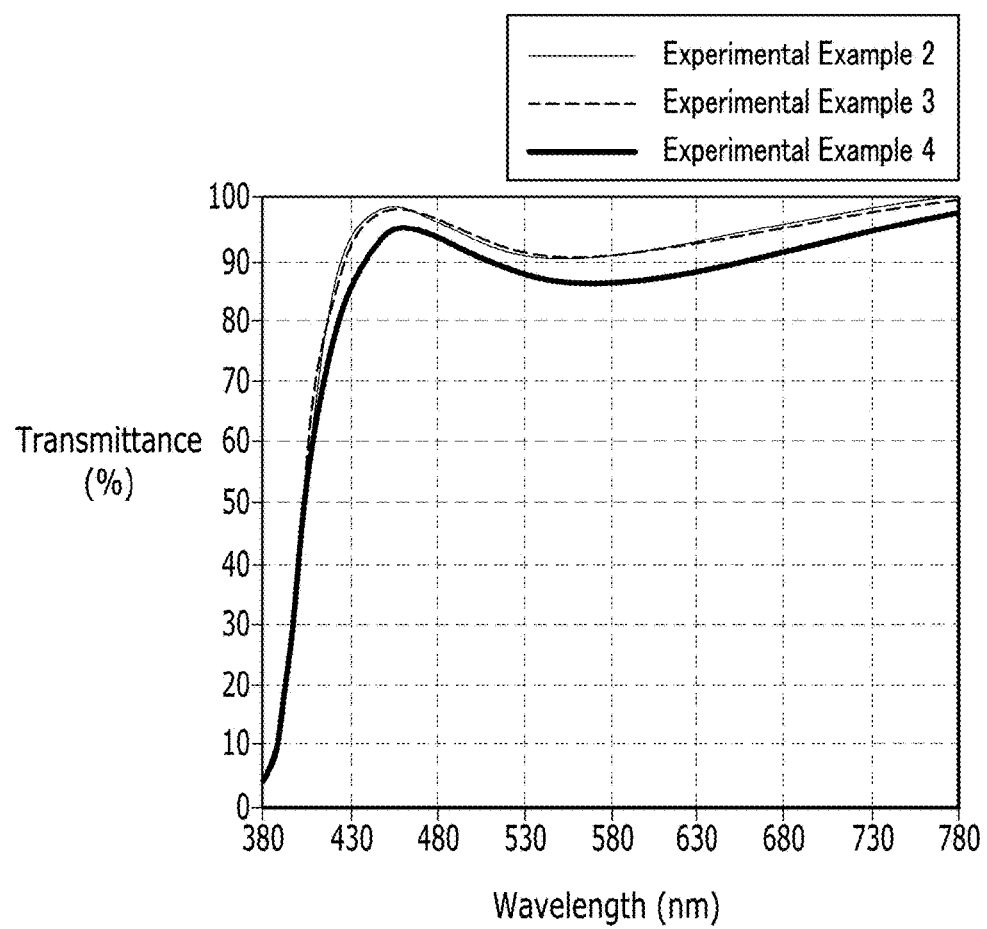
FIG. 8 is a graph showing a wavelength-transmittance in a transparent conductive layer included in an opto-electronic element according to an exemplary embodiment of the present disclosure.
Figure 9:
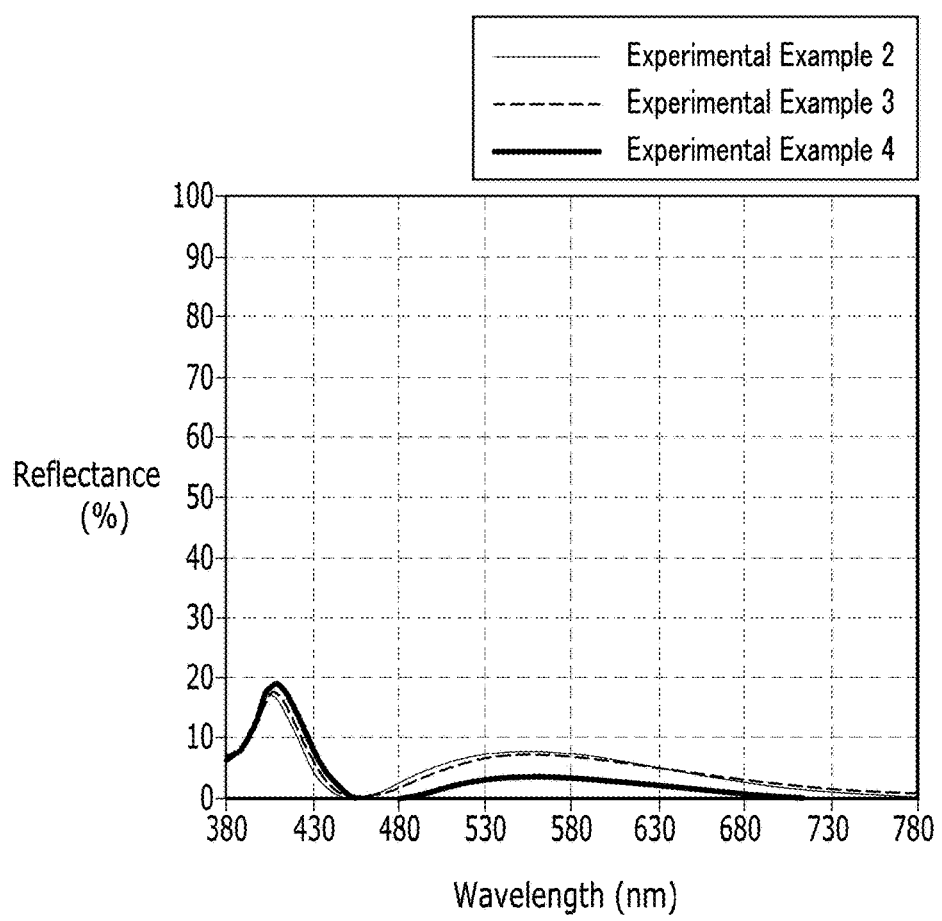
FIG. 9 is a graph showing a wavelength-reflectance in a transparent conductive layer included in an opto-electronic element according to an exemplary embodiment of the present disclosure.
Figure 10:
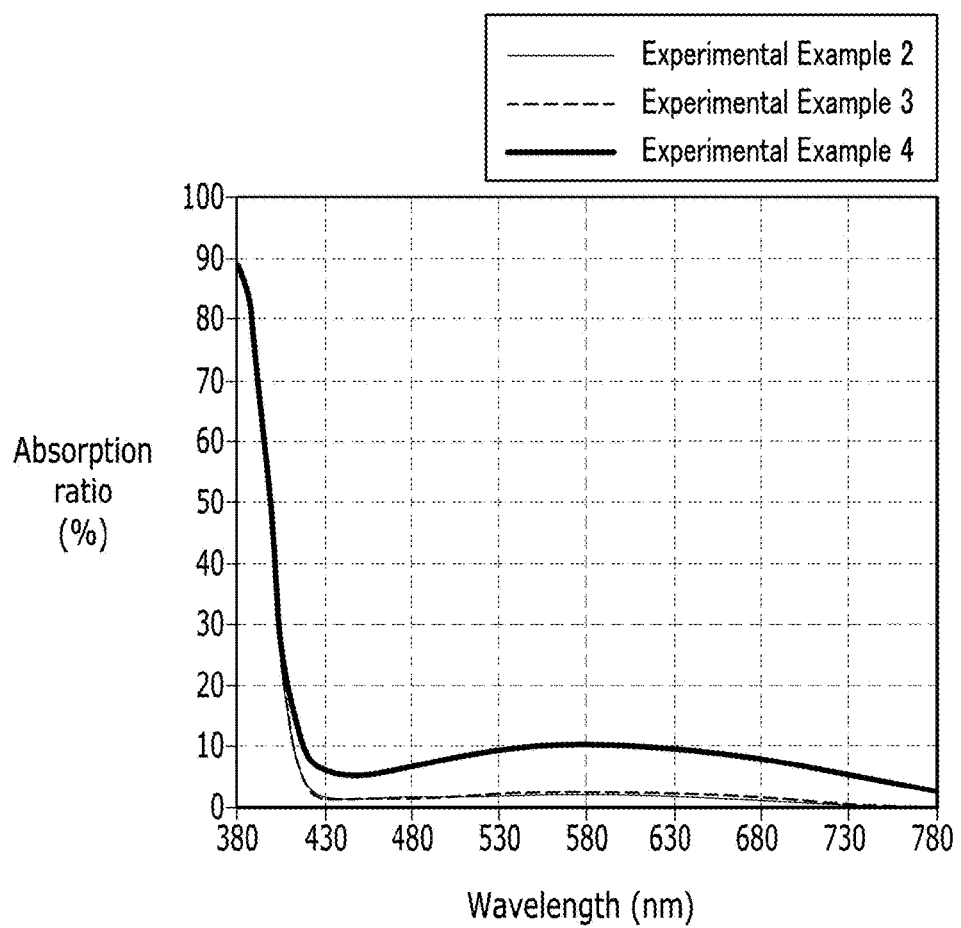
FIG. 10 is a graph showing a wavelength-absorption ratio in a transparent conductive layer included in an opto-electronic element according to an exemplary embodiment of the present disclosure.

FIG. 7 is a picture showing a transmittance change depending on a thickness change of each component in a transparent conductive layer included in an opto-electronic element according to an exemplary embodiment of the present disclosure. FIG. 8 is a graph showing a wavelength-transmittance relationship in a transparent conductive layer included in an opto-electronic element according to an exemplary embodiment of the present disclosure. FIG. 9 is a graph showing a wavelength-reflectance relationship in a transparent conductive layer included in an opto-electronic element according to an exemplary embodiment of the present disclosure. FIG. 10 is a graph showing a wavelength-absorption ratio in a transparent conductive layer included in an opto-electronic element according to an exemplary embodiment of the present disclosure.

Referring to FIG. 7, when ytterbium (Yb) is deposited on the bare glass, and rubidium iodide (RbI) is deposited on ytterbium (Yb), the degree of transparency appears to be depending on the thickness (e.g., the thickness of each respective layer).

The pictures shown in the first row of FIG. 7 are cases in which a thickness of 400 angstroms (Å), 200 angstroms (Å), and 100 angstroms (Å) of ytterbium (Yb) are deposited on the respective bare glasses. In this case, as the thickness of ytterbium (Yb) becomes thinner, the transmittance is increased, but the transmittance is not over (e.g., not greater than) about 60%.

Pictures shown in the second row of FIG. 7 are cases in which rubidium iodide (RbI) is deposited with a thickness of 50 angstroms (Å) after depositing ytterbium (Yb) on the bare glass with a thickness of 400 angstroms (Å), a thickness of 200 angstroms (Å), a thickness of 150 angstroms (Å), a thickness of 130 angstroms (Å), and a thickness of 100 angstroms (Å) on the respective bare glasses. In this case, while the transmittance is increased, the transmittance reaches about 85% or more.

Pictures shown in the third row of FIG. 7 are cases in which rubidium iodide (RbI) of 25 angstroms (Å) in thickness is deposited after depositing ytterbium (Yb) of 130 angstroms (Å) in thickness and 100 angstroms (Å) in thickness on the respective bare glasses. In this case, the transmittance is slightly decreased compared with the pictures of depositing ytterbium (Yb) of 130 angstroms (Å) and 100 angstroms (Å) from among the pictures shown in the second row of FIG. 7, however, the transmittance is equal to or more than about 75%.

Referring to FIG. 8 to FIG. 10, the transparent conductive layer of ytterbium (Yb) of 120 angstroms (Å) in thickness and rubidium iodide (RbI) of 25 angstroms (Å) in thickness (experimental example 2), the transparent conductive layer of ytterbium (Yb) of 130 angstroms (Å) and RbI of 25 angstroms (Å) in thickness (experimental example 3), and the transparent conductive layer of ytterbium (Yb) of 130 angstroms (Å) in thickness and RbI 25 of angstroms (Å) in thickness (experimental example 4) are deposited two times. Transmittance of 85% or more, reflectance of 10% or less, and the absorption ratio of 10% or less appear in the most visible light wavelength range in all of experimental examples 2, 3, and 4.

Hereinafter, an organic light emitting element utilizing the above-described transparent conductive layer will be described. The organic light emitting element may be one kind of the opto-electronic element.

Figure 11:
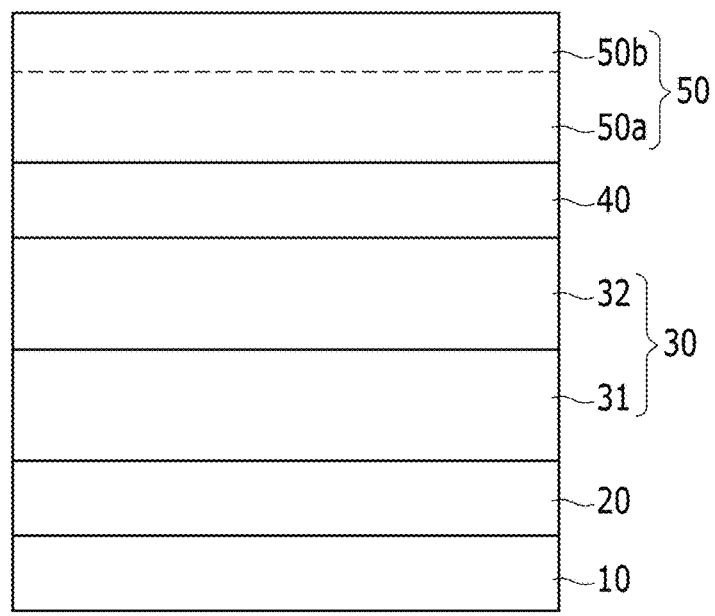
FIG. 11 is a cross-sectional view showing an organic light emitting element according to an exemplary embodiment of the present disclosure.
Figure 12:
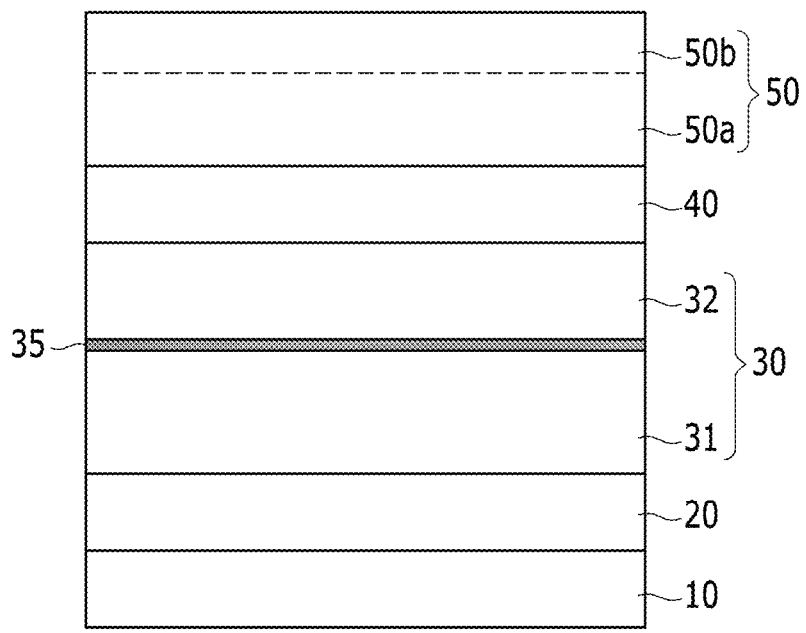
FIG. 12 is a cross-sectional view showing an exemplary embodiment in which a charge generation layer is added in the exemplary embodiment of FIG. 11.
Figure 13:
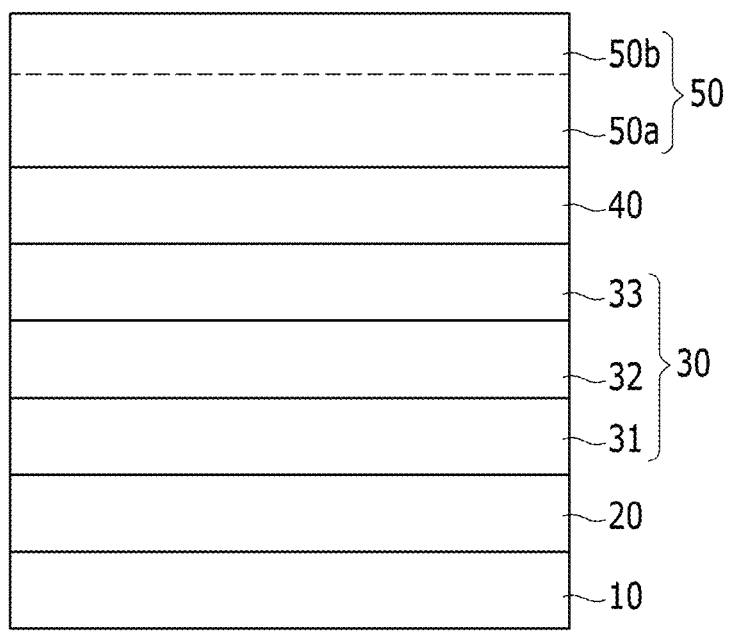
FIG. 13 is a cross-sectional view showing an organic light emitting element in which a structure of an emission layer is modified in the exemplary embodiment of FIG. 11.

FIG. 11 is a cross-sectional view showing an organic light emitting element according to an exemplary embodiment of the present disclosure. FIG. 12 is a cross-sectional view showing an exemplary embodiment in which a charge generation layer is added in the exemplary embodiment of FIG. 11. FIG. 13 is a cross-sectional view showing an organic light emitting element in which a structure of an emission layer is modified in the exemplary embodiment of FIG. 11.

Referring to FIG. 11, the organic light emitting element according to an exemplary embodiment of the present disclosure includes a first electrode 10, a hole transport region 20 positioned on the first electrode 10, an emission layer 30 positioned on the hole transport region 20, an electron transport region 40 positioned on the emission layer 30, and a second electrode 50 positioned on the electron transport region 40.

In the present exemplary embodiment, the first electrode 10 may be a reflective electrode. In the present specification, a reflective electrode refers to an electrode including a material having a light reflective characteristic to emit the light generated from the emission layer 30 to the second electrode 50. The first electrode 10 may include silver (Ag), aluminum (Al), chromium (Cr), molybdenum (Mo), tungsten (W), titanium (Ti), gold (Au), palladium (Pd), or an alloy layer thereof, or a triple layer structure of Ag/ITO/Ag or ITO/Ag/ITO.

The first electrode 10 may be formed by utilizing a sputtering method, a vapor phase deposition method, an ion beam deposition method, or an electron beam deposition method.

The hole transport region 20 may include an auxiliary layer positioned between the first electrode 10 and the emission layer 30. The hole transport region may include at least one of a hole transport layer and a hole injection layer. The hole transport layer may serve to smoothly transport holes transmitted from the first electrode 10. The hole transport layer may include an organic material.

The emission layer 30 may include blue, red, or green emission materials, and the emission layer 30 may include a host and a dopant. The material forming the emission layer 30 is not limited to the above.

As shown in FIG. 11, the emission layer 30 may include (e.g., consist of) two layers 31 and 32 emitting different colors. This may be a white organic light emitting element of a tandem type, and two layers emitting different colors may be mixed to emit white light. For example, one of two layers 31 and 32 may be a blue emission layer, and the other may be a yellow emission layer. By varying the exemplary embodiment of FIG. 11, as shown in FIG. 12, a charge generation layer 35 may be positioned between the two layers 31 and 32. The charge generation layer 35 is generally formed between the adjacent emission layers, thereby adjusting a charge balance between the adjacent emission layers.

Referring to FIG. 13, unlike in FIG. 11, the emission layer 30 includes three layers 31, 32, and 33, and the three layers 31, 32, and 33 may respectively emit red light, green light, and blue light, or blue light, yellow light, and blue light. Although not shown in FIG. 13, similarly to the description in FIG. 11, the charge generation layer may be positioned between the adjacent layers among the three layers 31, 32, and 33.

The combination of the plurality of emission layers 30 shown in FIG. 11 and FIG. 13 is only one example, and the structure of the plurality of emission layers may be varied so that white light may be realized by the combination of the emission layers emitting colors different from each other.

Again referring to FIG. 11 and FIG. 13, the electron transport region 40 may be positioned on the emission layer 30. The electron transport region 40 may include the auxiliary layer positioned between the emission layer 30 and the second electrode 50. The electron transport region 40 may include at least one of an electron transport layer and an electron injection layer. In this case, the electron transport layer may include the organic material.

Also, the electron transport layer may be formed by n-doping the compound selected from the above-described compounds with Group 1 elements, Group 2 elements, Lanthanide elements, or the halides thereof. The n-type characteristic of the electron transport layer is improved by the doping of Group 1 elements, Group 2 elements, Lanthanide elements, or the halides thereof.

In the present exemplary embodiment, to realize the front emission organic light emitting element, the second electrode 50 may be the transparent electrode (according to one or more embodiments of the present invention). In the present specification, the transparent electrode refers to an electrode passing (e.g., passing most of) the light generated from the emission layer 30, or passing most of the light that is generated from the emission layer 30 and reflected from the first electrode 10 (as the reflective electrode) to reach the user (viewer).

The second electrode 50 may include a material having a low work function for easy injection of electrons. To have the transparency and conductivity of the second electrode 50, ITO may be deposited by the plasma vapor deposition (PVD) method, but then the underlying organic material may be damaged by the plasma. Accordingly, the second electrode 50 according to the present exemplary embodiment may be formed as the transparent electrode by a thermal evaporation method, a solution method, and/or a chemical vapor deposition method, but not the plasma vapor deposition method. In one embodiment, the thermal evaporation method is utilized.

The second electrode 50 according to the present exemplary embodiment includes the first material made of the metal and the second material made of the metal halide. The metal of the first material may include at least one selected from Group 1 elements, Group 2 elements, Lanthanide elements, the transition metals, and the post transition metals; and the metal halide of the second material may include at least one selected from Group 1 element halides, Group 2 element halides, Lanthanide halides, Actinide halides, the transition metal halides, and the post transition metal halides. The refractive index of the second material made of the metal halide according to the present exemplary embodiment may be in the range of about 1.3 to about 2.5.

The second electrode 50 includes the lower region 50a and the upper region 50b, where the first material is distributed more than the second material in the lower region 50a, and the second material is distributed more than the first material in the upper region 50b. In the present exemplary embodiment, as the first material including ytterbium (Yb) having the relatively low work function is distributed more in the lower region 50a, electrons from the second electrode 50 may be smoothly injected to the emission layer 30. However, by varying the present exemplary embodiment, the second material may be distributed more than the first material in the lower region 50a, and the first material may be distributed more than the second material in the upper region 50b.

The metals included in the first material and the second material are substituted with each other to form a new compound such that the conductive material may be formed on and around the boundary where the lower region 50a and the upper region 50b meet. The conductive material may include free electrons and metal ions, for example, when RbI and Yb are reacted, RbI and Yb are substituted with each other, Yb combines with iodine to form $YbI_2$ or $YbI_3$, or a material having a perovskite structure such as $RbYbI_3$ may be made (e.g., formed). In this case, conductivity may be improved by the free electrons generated as $Rb^+$ is substituted with $Yb^{2+}$ and/or $Yb^{3+}$, the free electrons depending on (e.g., due to) the iodine vacancy, and/or the metal ions such as $Rb^+$, $Yb^{2+}$, and/or $Yb^{3+}$.

In the present exemplary embodiment, the first material and the second material may include metals having a similar electrode potential. The valence electron number of the metal included in the first material may be equal to or greater than the valence electron number of the metal of the metal halide included in the second material to substitute the metal included in the first material and the metal of the metal halide included in the second material with each other. If the valence electron number of the metal of the first material is larger than the valence electron number of the metal of the metal halide included in the second material, conductivity may be improved by the free electrons that are additionally generated. Also, if the metal of the first material combines with the halogen elements included in the metal halide of the second material such that a new material is formed, free electrons are formed depending on (e.g., due to) the halogen vacancy such that conductivity may be improved. Also, conductivity may be improved by the remaining metal ions that participate in the reaction.

In the present exemplary embodiment, the metal of the first material may include at least one selected from Yb, Tm, Sm, Eu, Gd, La, Ce, Pr, Nd, Pm, Tb, Dy, Ho, Er, Lu, Ac, Th, and Pa. In one embodiment, the metal of the first material is Lanthanide elements such as Yb and/or Sm.

In the present exemplary embodiment, the metal halide of the second material may include at least one selected from LiF, NaF, KF, RbF, CsF, BeF$_2$, MgF$_2$, CaF$_2$, SrF$_2$, BaF$_2$, YbF$_2$, YbF$_3$, SmF$_2$, SmF$_3$, EuF$_2$, EuF$_3$, TmF$_2$, TmF$_3$, CuF, TlF, AgF, CdF$_2$, HgF$_2$, SnF$_2$, PbF$_2$, BiF$_3$, ZnF$_2$, MnF$_2$, FeF$_2$, GeF$_2$, CoF$_2$, NiF$_2$, AlF$_3$, ThF$_4$, UF$_3$, LiCl, NaCl, KCl, RbCl, CsCl, BeCl$_2$, MgCl$_2$, CaCl$_2$, SrCl$_2$, BaCl$_2$, YbCl$_2$, YbCl$_3$, SmCl$_2$, SmCl$_3$, EuCl$_2$, EuCl$_3$, TmCl$_2$, TmCl$_3$, CuCl, TlCl, AgCl, CdCl$_2$, HgCl$_2$, SnCl$_2$, PbCl$_2$, BiCl$_3$, ZnCl$_2$, MnCl$_2$, FeCl$_2$, GeCl$_2$, CoCl$_2$, NiCl$_2$, AlCl$_3$, ThCl$_4$, UCl$_3$, LiBr, NaBr, KBr, RbBr, CsBr, BeBr$_2$, MgBr$_2$, CaBr$_2$, SrBr$_2$, BaBr$_2$, YbBr$_2$, YbBr$_3$, SmBr$_2$, SmBr$_3$, EuBr$_2$, EuBr$_3$, TmBr$_2$, TmBr$_3$, CuBr, TlBr, AgBr, CdBr$_2$, HgBr$_2$, SnBr$_2$, PbBr$_2$, BiBr$_3$, ZnBr$_2$, MnBr$_2$, FeBr$_2$, GeBr$_2$, CoBr$_2$, NiBr$_2$, AlBr$_3$, ThBr$_4$, UBr$_3$, LiI, NaI, KI, RbI, CsI, BeI$_2$, MgI$_2$, CaI$_2$, SrI$_2$, BaI$_2$, YbI$_2$, YbI$_3$, SmI$_2$, SmI$_3$, EuI$_2$, EuI$_3$, TmI$_2$, TmI$_3$, CuI, TlI, AgI, CdI$_2$, HgI$_2$, SnI$_2$, PbI$_2$, BiI$_3$, ZnI$_2$, MnI$_2$, FeI$_2$, GeI$_2$, CoI$_2$, NiI$_2$, AlI$_3$, ThI$_4$, and UI$_3$.

In the present exemplary embodiment, the second electrode 50 may have a transmittance of equal to or more than 75% in the visible light region, for example, equal to or more than 85%, and a sheet resistance (e.g., conductivity) of equal to or less than 500Ω/□.

In the present exemplary embodiment, the first electrode 10 is the reflective electrode and the second electrode 50 is the transparent electrode, however, the first electrode 10 may be the transparent electrode and the second electrode 50 may be the reflective electrode.

The above-described organic light emitting element may be formed by the following method. The first electrode of the reflective electrode is formed on the substrate, and the emission layer is formed on the first electrode. The electron transport layer included in the electron transport region may be formed on the emission layer. The lower layer made of the first material is formed on the electron transport layer, and the upper layer made of the second material is formed on the lower layer.

In this case, without separate heat treatment, the first material of the lower layer and the second material of the upper layer are diffused, and the first material and the second material are reacted such that the second electrode 50 that is both transparent and has conductivity (e.g., a suitable conductivity) is formed.

Figure 14:
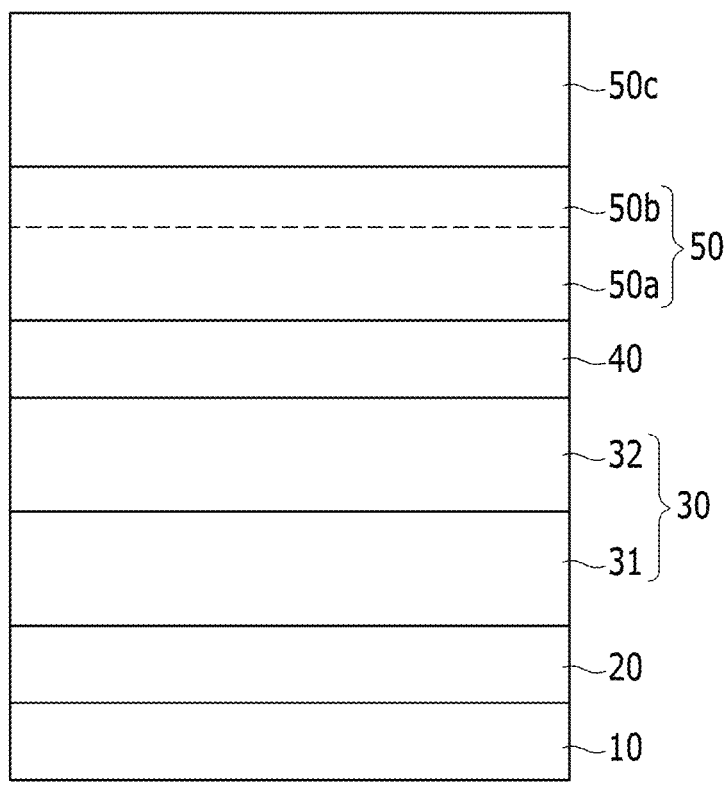
FIG. 14 is a cross-sectional view showing an organic light emitting element in which an electrode structure is modified in the exemplary embodiment of FIG. 11.
Figure 15:
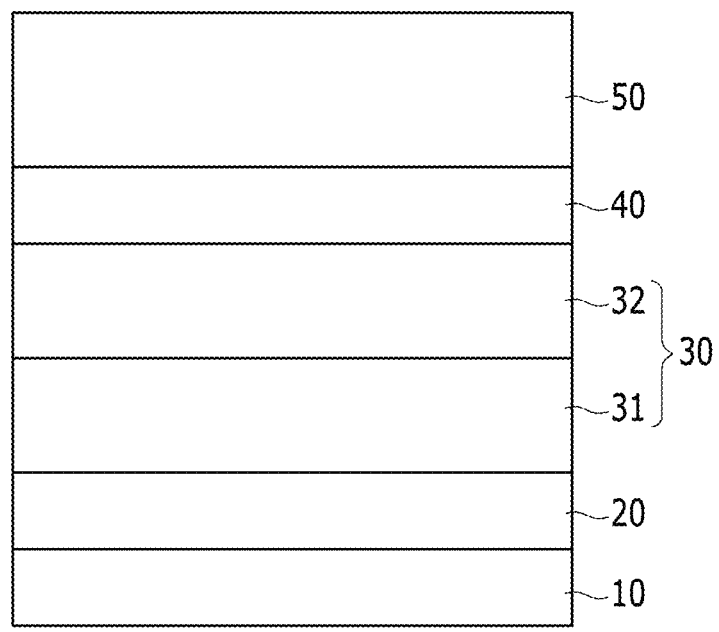
FIG. 15 is a cross-sectional view showing an organic light emitting element in which an electrode structure is modified in the exemplary embodiment of FIG. 11.

FIG. 14 and FIG. 15 are cross-sectional views of a varied exemplary embodiment of an electrode structure from the exemplary embodiment of FIG. 11. The exemplary embodiment shown in FIG. 14 and FIG. 15 is the same as the exemplary embodiment of FIG. 11, and thus only differences will be described.

Referring to FIG. 14, the second electrode 50 of FIG. 11 further includes a metal oxide layer 50c positioned on the upper region 50b. The metal oxide layer 50c may include ITO or IZO. The second electrode 50 may be formed of a dual transparent electrode structure made of the transparent electrode (including the lower region 50a and the upper region 50b formed by the thermal evaporation method) and the metal oxide layer 50c.

Referring to FIG. 15, unlike in FIG. 11, the second electrode 50 may be formed as one layer by co-deposition. The description related to the second electrode 50 having the single layer structure formed by the co-deposition may be applied to the description of the exemplary embodiment of FIG. 1.

Figure 16:
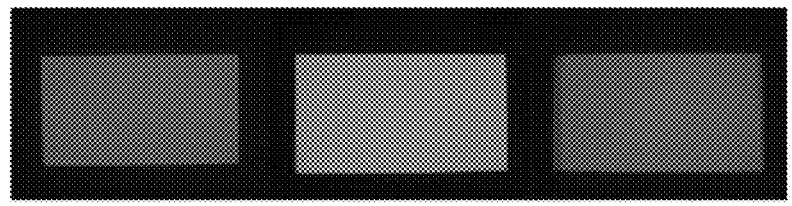
FIG. 16 is a picture showing that an opto-electronic element according to an exemplary embodiment of the present disclosure is lighting.

FIG. 16 is a picture showing that an opto-electronic element according to an exemplary embodiment of the present disclosure is lit.

Referring to FIG. 16, the opto-electronic element including the transparent conductive layer according to an exemplary embodiment of the present disclosure includes a red element, a green element, and a blue element, and the elements may respectively emit red light, green light, and blue light.

In addition, Table 1 shows the emission efficiency when the second electrode 50 of the organic light emitting element shown in FIG. 11 to FIG. 15 is formed of the transparent conductive layer according to an exemplary embodiment of the present disclosure. In Table 1, comparative example 2 is an electrode made of 13 angstroms (Å) in thickness of ytterbium (Yb) and 85 angstroms (Å) in thickness of silver-magnesium alloy (AgMg), and comparative example 3 is an electrode made of 1500 angstroms (Å) in thickness of only ITO.

For each of the electrodes of experimental example 5 to experimental example 14, the lower layer made of ytterbium (Yb) and the upper layer made of rubidium iodide (RbI) are formed and then the materials thereof are reacted to form the transparent conductive layer. For each of the electrodes of experimental example 15 to experimental example 18, the lower layer made of rubidium iodide (RbI) and the upper layer made of ytterbium (Yb) are formed, and then the materials thereof are reacted to form the transparent conductive layer. For each of the electrodes of experimental example 20 and experimental example 21, ytterbium and rubidium iodide are co-deposited to form the transparent conductive layer. For each of the electrodes of experimental example 22 to experimental example 29, ytterbium, rubidium iodide and ITO are sequentially deposited to form the transparent conductive layer. For each of the electrodes of experimental example 30 to experimental example 43, the lower layer made of one of ytterbium and europium and the upper layer made of one of cesium iodide (CsI), potassium iodide (KI), natrium iodide (NaI), and rubidium iodide (RbI) are formed and the materials thereof are reacted to form the transparent conductive layer. In Table 1, the number to the right of each material represents its thickness (angstroms).

TABLE 1

| | Electrode structure of blue light-emitting diode display | Efficiency (cd/A), color coordinate (B_y) |
|---|---|---|
| Comparative Example 2 | Yb 13/AgMg 85 | 118, B_y = 0.058 |
| Comparative Example 3 | ITO 1500 | No Lighting |
| Experimental Example 5 | Yb 50/RbI 50 | 84.0, B_y = 0.060 |
| Experimental Example 6 | Yb 50/RbI 100 | 83.0, B_y = 0.067 |
| Experimental Example 7 | Yb 50/RbI 200 | 84.3, B_y = 0.071 |
| Experimental Example 8 | Yb 50/RbI 300 | 80.1, B_y = 0.075 |
| Experimental Example 9 | Yb 50/RbI 400 | 77.3, B_y = 0.081 |
| Experimental Example 10 | Yb 100/RbI 50 | 80.0, B_y = 0.060 |
| Experimental Example 11 | Yb 100/RbI 100 | 81.0, B_y = 0.061 |
| Experimental Example 12 | Yb 100/RbI 200 | 83.2, B_y = 0.062 |
| Experimental Example 13 | Yb 100/RbI 300 | 80.1, B_y = 0.066 |
| Experimental Example 14 | Yb 100/RbI 400 | 77.3, B_y = 0.067 |
| Experimental Example 15 | RbI 50/Yb 100 | 81.1, B_y = 0.063 |
| Experimental Example 16 | RbI 100/Yb 100 | 80.4, B_y = 0.065 |
| Experimental Example 17 | RbI 200/Yb 100 | 76.6, B_y = 0.066 |
| Experimental Example 18 | RbI 400/Yb 100 | 75.5, B_y = 0.068 |
| Experimental Example 19 | Yb: RbI 1:1200 | 67.2, B_y = 0.067 |
| Experimental Example 20 | Yb:RbI 1:2200 | 80.3, B_y = 0.075 |
| Experimental Example 21 | Yb:RbI 1:4200 | 83.4, B_y = 0.073 |
| Experimental Example 22 | Yb 50/RbI 100/ITO 1500 | 85.2, B_y = 0.067 |
| Experimental Example 23 | Yb 50/RbI 200/ITO 1500 | 82.3, B_y = 0.071 |
| Experimental Example 24 | Yb 50/RbI 300/ITO 1500 | 73.2, B_y = 0.075 |
| Experimental Example 25 | Yb 50/RbI 400/ITO 1500 | 65.3, B_y = 0.081 |
| Experimental Example 26 | Yb 100/RbI 100/ITO 1500 | 87.2, B_y = 0.059 |
| Experimental Example 27 | Yb 100/RbI 200/ITO 1500 | 84.3, B_y = 0.062 |
| Experimental Example 28 | Yb 100/RbI 300/ITO 1500 | 74.2, B_y = 0.067 |
| Experimental Example 29 | Yb 100/RbI 400/ITO 1500 | 66.3, B_y = 0.073 |
| Experimental Example 30 | Yb 50/CsI 100 | 79.0, B_y = 0.067 |
| Experimental Example 31 | Yb 100/CsI 300 | 78.1, B_y = 0.066 |
| Experimental Example 32 | Yb 50/KI 100 | 83.6, B_y = 0.067 |
| Experimental Example 33 | Yb 100/KI 300 | 85.1, B_y = 0.066 |
| Experimental Example 34 | Yb 50/NaI 100 | 66.3, B_y = 0.062 |
| Experimental Example 35 | Yb 100/NaI 300 | 65.1, B_y = 0.062 |
| Experimental Example 36 | Eu 50/RbI 100 | 85.0, B_y = 0.063 |
| Experimental Example 37 | Eu 100/RbI 300 | 82.2, B_y = 0.067 |
| Experimental Example 38 | Eu 50/CsI 100 | 83.7, B_y = 0.065 |
| Experimental Example 39 | Eu 100/CsI 300 | 85.1, B_y = 0.064 |
| Experimental Example 40 | Eu 50/KI 100 | 84.2, B_y = 0.066 |
| Experimental Example 41 | Eu 100/KI 300 | 85.1, B_y = 0.067 |
| Experimental Example 42 | Eu 50/NaI 100 | 70.9, B_y = 0.061 |
| Experimental Example 43 | Eu 100/NaI 300 | 68.1, B_y = 0.060 |

Referring to Table 1, compared to comparative example 2 utilizing the metal electrode, the blue emission efficiency is relatively decreased in each of experimental example 3 to experimental example 43. However, this phenomenon is because comparative example 2 has the effect of optical resonance due to the reflective electrode included in comparative example 2, but the effect of optical resonance is deteriorated in each of experimental example 5 to experimental example 43 because of a non-resonance characteristic due to the use of the transparent electrode in each of experimental example 5 to experimental example 43. Accordingly, it may be confirmed that the transparent electrode is formed when forming the electrode according to the present exemplary embodiment through the result. As shown in the experimental examples of Table 1, when forming the transparent conductive layer of the lamination structure or the co-deposition structure of Yb and RbI, lighting (light) is obtained without errors, and this may be confirmed by the fact that the efficiency deviation of the lamination structure and the co-deposition structure are not large. This is the result when the reaction between two materials (e.g., the first material and the second material) are sufficiently stable in the lamination structure and the co-deposition structure such that substantially the same characteristic may be obtained.

An organic light emitting diode display including the above-described organic light emitting element will be described with reference to FIG. 17.

Figure 17:
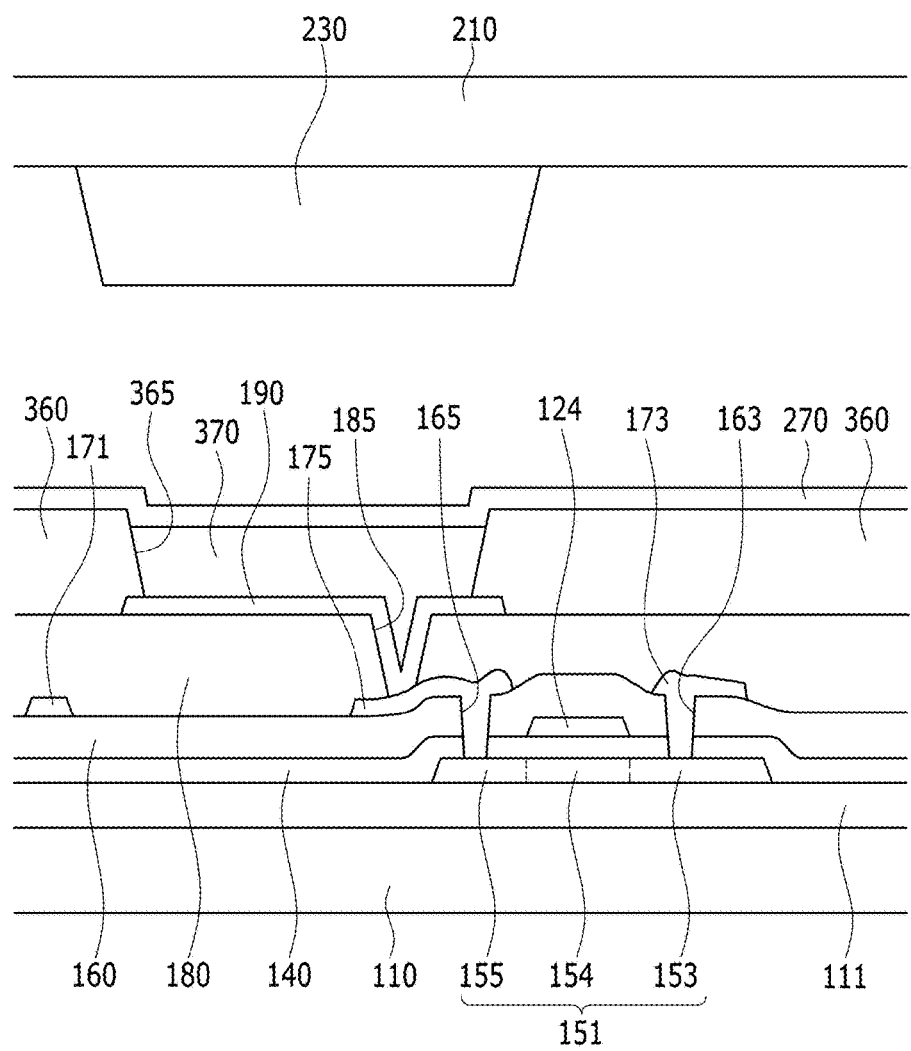
FIG. 17 is a cross-sectional view showing an organic light emitting diode display according to an exemplary embodiment of the present disclosure.

FIG. 17 is a cross-sectional view showing an organic light emitting diode display according to an exemplary embodiment of the present disclosure.

Referring to FIG. 17, a blocking layer 111 made of a silicon oxide or silicon nitride is formed on a substrate 110 made of transparent glass. The blocking layer 111 may have a dual-layered structure.

A semiconductor layer 151 made of polysilicon is positioned on the blocking layer 111. The semiconductor layer may include a plurality of extrinsic regions including an n-type or p-type conductive impurity, and at least one intrinsic region including no conductive impurity.

In the semiconductor layer 151, the extrinsic regions include the source and drain regions 153 and 155, which may be doped with a p-type impurity and are separated from each other. The intrinsic region may include a channel region 154 positioned between the source and drain regions 153 and 155 and a storage region extending upward from the source and drain regions 153 and 155.

The extrinsic region may further include a lightly doped region disposed between the channel region 154 and the source and drain regions 153 and 155. The lightly doped region may be replaced with an offset region of which impurity is barely included.

Alternatively, the source and drain regions 153 and 155 may be doped with the n-type impurity. The conductive p-type impurity may be boron (B) and/or gallium (Ga), and the n-type conductive impurity may be phosphorus (P) and/or arsenic (As).

A gate insulating layer 140, for example, made of a silicon nitride and/or a silicon oxide, is formed on the semiconductor layer 151 and the blocking layer 111.

A gate line and a control electrode 124 are positioned on the gate insulating layer 140.

The gate line transmits a gate signal and substantially extends in a horizontal direction. The control electrode 124 is separated from the gate line and overlaps the channel region 154 of the semiconductor layer 151.

An interlayer insulating layer 160 is positioned on the control electrode 124. The interlayer insulating layer 160 is made of an inorganic insulator (such as silicon nitride and/or silicon oxide), an organic insulator, and/or an insulating material having a low dielectric constant.

The interlayer insulating layer 160 and the gate insulating layer 140 have a plurality of contact holes 163 and 165 exposing the source and drain regions 153 and 155.

A plurality of data conductors (including a data line 171, a driving voltage line, and an output electrode 175) is formed on the interlayer insulating layer 160.

The data line 171 transmits a data signal and substantially extends in a vertical direction, thereby crossing the gate line.

The driving voltage line transmits a driving voltage and substantially extends in the vertical direction, thereby crossing the gate line. The driving voltage line includes an input electrode 173 connected to the source region 153 through the contact hole 163.

A passivation layer 180 is disposed on the data conductors 171 and 175. The passivation layer 180 is made of an inorganic insulator, an organic insulator, and/or an insulating material having a low dielectric constant.

The passivation layer 180 has a contact hole 185 exposing an output electrode 175. The passivation layer 180 may have a plurality of contact holes exposing an end of the data line 171, and the passivation layer 180 and the interlayer insulating layer 160 may have a plurality of contact holes exposing an end of the gate line.

A first electrode 190 is disposed on the passivation layer 180. The first electrode 190 is physically and electrically connected to the output electrode 175 through the contact hole 185 and may be a reflective electrode, similar to the exemplary embodiment of the above-described organic light emitting element. That is, the first electrode 190 may include silver (Ag), aluminum (Al), chromium (Cr), molybdenum (Mo), tungsten (W), titanium (Ti), gold (Au), palladium (Pd), or an alloy layer thereof, or may have a triple layered structure of silver (Ag)/indium tin oxide (ITO)/silver (Ag) or indium tin oxide (ITO)/silver (Ag)/indium tin oxide (ITO).

A partition 360 is positioned on the passivation layer 180. The partition 360 defines an opening by enclosing edges of the first electrode 190 like a bank (e.g., as a bank), and are made of an organic insulator and/or an inorganic insulator. The partition 360 may be made of a photoresist including black pigments, and the partitions 360 function as a light blocking member in this case.

A light-emitting element layer 370 is disposed on the first electrode 190, and a second electrode 270 is disposed on the light-emitting element layer 370. As such, the organic light emitting element (including the first electrode 190, the light-emitting element layer 370, and the second electrode 270) is formed.

The description of the organic light emitting element may be applied with the above-described contents. For example, the second electrode 270 of the organic light emitting element may be the transparent electrode including the above-described transparent conductive layer to generate front emission of white light, and the transparent electrode includes the first material made of the metal and the second material made of the metal halide.

Herein, the first electrode 190 may be (e.g., is) an anode as the hole injection electrode, and the second electrode 270 may be (e.g., is) a cathode as the electron injection electrode. However, the present exemplary embodiment is not necessarily limited thereto, and the first electrode 190 may be (e.g., is) the cathode and the second electrode 270 may be (e.g., is) the anode depending on a driving method of the organic light emitting diode display. Holes and electrons are injected into the light-emitting element layer 370 from the first electrode 190 and the second electrode 270, respectively, and exitons generated by coupling the injected holes and electrons fall from an excited state to a ground state to emit light.

In the present exemplary embodiment, the emission layer included in the light-emitting element layer 370 may include two layers or three layers emitting light of different colors as described above. The emission layers of two layers may be mixed with each other to emit white light, and the emission layers of three layers may respectively emit red light, green light, and blue light, or blue light, yellow light, and blue light.

The white light emitted through the second electrode 270 passes through the color filter 230 positioned on the second electrode 270 of the transparent electrode, thereby realizing a desired color. As shown in FIG. 12, the color filter 230 may be disposed on the lower surface of the encapsulation substrate 210. However, the arrangement of the color filter 230 is not limited to this structure, and the color filter 230 may be positioned under or on the thin film encapsulation layer in the structure that the thin film encapsulation layer is formed on the second electrode 270.

FIG. 17 only shows one color filter 230. However, it shows the part corresponding to one sub-pixel. In the organic light emitting diode display according to the present exemplary embodiment, a plurality of color filters 230 may be formed to correspond to the respective second electrodes 270 respectively positioned on the plurality of sub-pixels. The plurality of color filters 230 may be red, blue, or green color filters.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims, and equivalents thereof.

| Description of some of the symbols | | | |
|---|---|---|---|
| 10, 190 | first electrode | 30 | emission layer |
| 50, 270 | second electrode | 230 | color filter |
| 360 | partition | 365 | opening |

What is claimed is:

1. An opto-electronic element comprising:
a transparent conductive layer formed by a reaction of a first material made of a metal and a second material made of a metal halide,
wherein the transparent conductive layer is a single layer,
wherein the metal halide of the second material comprises at least one selected from the group consisting of chloride, bromide and iodide of Group 1 elements, chloride, bromide and iodide of Group 2 elements, Lanthanide halides, Actinide halides, halides of transition metals, and halides of post transition metals, and
wherein the metal of the first material comprises at least one selected from the group consisting of Yb, Tm, Sm, Eu, Gd, La, Ce, Pr, Nd, Pm, Tb, Dy, Ho, Er, Lu, Ac, Th, and Pa.

2. The opto-electronic element of claim 1, wherein:
a valence electron number of the metal of the first material is equal to or greater than a valence electron number of the metal of the metal halide included in the second material.

3. The opto-electronic element of claim 1, wherein:
the metal of the first material comprises at least one selected from the group consisting of Group 1 elements, Group 2 elements, Lanthanide elements, Actinide elements, transition metals, and post transition metals.

4. The opto-electronic element of claim 1, wherein:
the metal halide of the second material comprises at least one selected from the group consisting of $YbF_2$, $YbF_3$, $SmF_2$, $SmF_3$, $EuF_2$, $EuF_3$, $TmF_2$, $TmF_3$, $CuF$, $TlF$, $AgF$, $CdF_2$, $HgF_2$, $SnF_2$, $PbF_2$, $BiF_3$, $ZnF_2$, $MnF_2$, $FeF_2$, $GeF_2$, $CoF_2$, $NiF_2$, $AlF_3$, $ThF_4$, $UF_3$, $LiCl$, $NaCl$, $KCl$, $RbCl$, $CsCl$, $BeCl_2$, $MgCl_2$, $CaCl_2$, $SrCl_2$, $BaCl_2$, $YbCl_2$, $YbCl_3$, $SmCl_2$, $SmCl_3$, $EuCl_2$, $EuCl_3$, $TmCl_2$, $TmCl_3$, $CuCl$, $TlCl$, $AgCl$, $CdCl_2$, $HgCl_2$, $SnCl_2$, $PbCl_2$, $BiCl_3$, $ZnCl_2$, $MnCl_2$, $FeCl_2$, $GeCl_2$, $CoCl_2$, $NiCl_2$, $AlCl_3$, $ThCl_4$, $UCl_3$, $LiBr$, $NaBr$, $KBr$, $RbBr$, $CsBr$, $BeBr_2$, $MgBr_2$, $CaBr_2$, $SrBr_2$, $BaBr_2$, $YbBr_2$, $YbBr_3$, $SmBr_2$, $SmBr_3$, $EuBr_2$, $EuBr_3$, $TmBr_2$, $TmBr_3$, $CuBr$, $TlBr$, $AgBr$, $CdBr_2$, $HgBr_2$, $SnBr_2$, $PbBr_2$, $BiBr_3$, $ZnBr_2$, $MnBr_2$, $FeBr_2$, $GeBr_2$, $CoBr_2$, $NiBr_2$, $AlBr_3$, $ThBr_4$, $UBr_3$, $LiI$, $NaI$, $KI$, $RbI$, $CsI$, $BeI_2$, $MgI_2$, $CaI_2$, $SrI_2$, $BaI_2$, $YbI_2$, $YbI_3$, $SmI_2$, $SmI_3$, $EuI_2$, $EuI_3$, $TmI_2$, $TmI_3$, $CuI$, $TlI$, $AgI$, $CdI_2$, $HgI_2$, $SnI_2$, $PbI_2$, $BiI_3$, $ZnI_2$, $MnI_2$, $FeI_2$, $GeI_2$, $CoI_2$, $NiI_2$, $AlI_3$, $ThI_4$, and $UI_3$.

5. The opto-electronic element of claim 1, wherein:
the transparent conductive layer comprises more of the first material than the second material.

6. The opto-electronic element of claim 1, wherein:
the transparent conductive layer comprises a same amount of the first material and the second material, or the transparent conductive layer comprises more of the second material than the first material.

7. The opto-electronic element of claim 1, further comprising:
a metal oxide layer on the transparent conductive layer.

8. The opto-electronic element of claim 7, wherein:
the metal oxide layer comprises ITO and/or IZO.

9. The opto-electronic element of claim 1, further comprising:
a first electrode;
an emission layer on the first electrode; and
a second electrode on the emission layer, and
at least one of the first electrode and the second electrode comprises the transparent conductive layer.

10. The opto-electronic element of claim 9, wherein:
the first electrode is a reflective electrode, and the second electrode comprises the transparent conductive layer.

11. The opto-electronic element of claim 9, wherein:
the emission layer is to emit white light by a combination of a plurality of emission layers.

12. The opto-electronic element of claim 11, wherein:
the plurality of emission layers comprises two layers or three layers.

13. The opto-electronic element of claim 12, wherein:
the plurality of emission layers comprises two layers, and light emitted from the plurality of emission layers is mixed to emit white light.

14. The opto-electronic element of claim 12, wherein:
the plurality of emission layers comprises three layers, and the plurality of emission layers are to respectively emit red light, green light, and blue light; or blue light, yellow light, and blue light.

15. The opto-electronic element of claim 12, further comprising:
a charge generation layer between the plurality of emission layers.

16. The opto-electronic element of claim 9, wherein:
at least one of the first electrode and the second electrode comprises a lower region comprising more of the first material than the second material, and an upper region comprising more of the second material than the first material.

17. The opto-electronic element of claim 16, wherein:
in the at least one of the first electrode and the second electrode, an amount of the first material increases from an upper side to a lower side, and an amount of the second material increases from the lower side to the upper side.

18. The opto-electronic element of claim 16, further comprising:
a metal oxide layer on the upper region, and the metal oxide layer comprises ITO and/or IZO.

19. A method for manufacturing an opto-electronic element, the method comprising:
forming a transparent conductive layer by a reaction of a first material made of a metal and a second material made of a metal halide,
wherein the transparent conductive layer is a single layer,
wherein the metal halide of the second material comprises at least one selected from the group consisting of chloride, bromide and iodide of Group 1 elements, chloride, bromide and iodide of Group 2 elements, Lanthanide halides, Actinide halides, halides of transition metals, and halides of post transition metals, and
wherein the metal of the first material comprises at least one selected from the group consisting of Yb, Tm, Sm, Eu, Gd, La, Ce, Pr, Nd, Pm, Tb, Dy, Ho, Er, Lu, Ac, Th, and Pa.

20. The method of claim 19, wherein:
the metal halide of the second material comprises at least one selected from the group consisting of $YbF_2$, $YbF_3$, $SmF_2$, $SmF_3$, $EuF_2$, $EuF_3$, $TmF_2$, $TmF_3$, $CuF$, $TlF$, $AgF$, $CdF_2$, $HgF_2$, $SnF_2$, $PbF_2$, $BiF_3$, $ZnF_2$, $MnF_2$, $FeF_2$, $GeF_2$, $CoF_2$, $NiF_2$, $AlF_3$, $ThF_4$, $UF_3$, $LiCl$, $NaCl$, $KCl$, $RbCl$, $CsCl$, $BeCl_2$, $MgCl_2$, $CaCl_2$, $SrCl_2$, $BaCl_2$, $YbCl_2$, $YbCl_3$, $SmCl_2$, $SmCl_3$, $EuCl_2$, $EuCl_3$, $TmCl_2$, $TmCl_3$, $CuCl$, $TlCl$, $AgCl$, $CdCl_2$, $HgCl_2$, $SnCl_2$, $PbCl_2$, $BiCl_3$, $ZnCl_2$, $MnCl_2$, $FeCl_2$, $GeCl_2$, $CoCl_2$, $NiCl_2$, $AlCl_3$, $ThCl_4$, $UCl_3$, $LiBr$, $NaBr$, $KBr$, $RbBr$, $CsBr$, $BeBr_2$, $MgBr_2$, $CaBr_2$, $SrBr_2$, $BaBr_2$, $YbBr_2$, $YbBr_3$, $SmBr_2$, $SmBr_3$, $EuBr_2$, $EuBr_3$, $TmBr_2$, $TmBr_3$, CuBr, TlBr, AgBr, $CdBr_2$, $HgBr_2$, $SnBr_2$, $PbBr_2$, $BiBr_3$, $ZnBr_2$, $MnBr_2$, $FeBr_2$, $GeBr_2$, $CoBr_2$, $NiBr_2$, $AlBr_3$, $ThBr_4$, $UBr_3$, LiI, NaI, KI, RbI, CsI, $BeI_2$, $MgI_2$, $CaI_2$, $SrI_2$, $BaI_2$, $YbI_2$, $YbI_3$, $SmI_2$, $SmI_3$, $EuI_2$, $EuI_3$, $TmI_2$, $TmI_3$, CuI, TlI, AgI, $CdI_2$, $HgI_2$, $SnI_2$, $PbI_2$, $BiI_3$, $ZnI_2$, $MnI_2$, $FeI_2$, $GeI_2$, $CoI_2$, $NiI_2$, $AlI_3$, $ThI_4$, and $UI_3$.

21. The method of claim 19, further comprising:

forming a first electrode;

forming an emission layer on the first electrode; and forming a second electrode on the emission layer, wherein at least one of the forming of the first electrode and the forming of the second electrode comprises depositing a lower layer comprising the first material and an upper layer comprising the second material on the lower layer, diffusing the first material and the second material, and forming the transparent conductive layer.

22. The method of claim 21, wherein:

during the forming of the transparent conductive layer, the metals included in the first material and the second material are substituted with each other.

23. The method of claim 22, wherein:

the first material is distributed more than the second material in a lower side of the transparent conductive layer.

24. The method of claim 21, further comprising:

forming a metal oxide layer on the transparent conductive layer.

25. The method of claim 21, wherein:

at least one of the forming of the first electrode and the forming of the second electrode utilizes a solution method, a thermal evaporation method, a physical vapor deposition method, and/or a chemical vapor deposition method.

26. The method of claim 21, wherein:

the first electrode is a reflective electrode, and the second electrode comprises the transparent conductive layer.

27. The method of claim 19, further comprising:

forming a first electrode;

forming an emission layer on the first electrode; and forming a second electrode on the emission layer, and at least one of the forming of the first electrode and the forming of the second electrode comprises co-depositing the first material and the second material to form the transparent conductive layer.

* * * * *